(12) United States Patent
Wei et al.

(10) Patent No.: US 10,356,966 B2
(45) Date of Patent: Jul. 16, 2019

(54) BRACKET, ELECTRONIC MODULE, AND TERMINAL DEVICE

(71) Applicant: GUANGDONG OPPO MOBILE TELECOMMUNICATIONS CORP., LTD., Dongguan, Guangdong (CN)

(72) Inventors: Yi Wei, Guangdong (CN); Yong Li, Guangdong (CN); Peiju Chen, Guangdong (CN)

(73) Assignee: Guangdong Oppo Mobile Telecommunications Corp., LTD., Dongguan (CN)

( * ) Notice: Subject to any disclaimer, the term of this patent is extended or adjusted under 35 U.S.C. 154(b) by 0 days.

(21) Appl. No.: 15/830,296

(22) Filed: Dec. 4, 2017

(65) Prior Publication Data

US 2018/0177082 A1 Jun. 21, 2018

(30) Foreign Application Priority Data

Dec. 20, 2016 (CN) .......................... 2016 1 1185477

(51) Int. Cl.
*H04N 5/225* (2006.01)
*H05K 9/00* (2006.01)
(Continued)

(52) U.S. Cl.
CPC .......... *H05K 9/0064* (2013.01); *G03B 17/12* (2013.01); *G06F 1/1686* (2013.01);
(Continued)

(58) Field of Classification Search
CPC .. H04N 5/2252; H04N 5/2253; H04N 5/2257; H04N 5/2258; H05K 9/0064; H05K 9/0009
See application file for complete search history.

(56) References Cited

U.S. PATENT DOCUMENTS 6,433,416 B1 * 8/2002 Buj ....................... H01L 23/528
257/691
7,317,476 B2 * 1/2008 Haruyama .......... H04M 1/0264
348/211.2
(Continued)

FOREIGN PATENT DOCUMENTS

CN  102804055 A  11/2012
CN  202652361 U   1/2013
(Continued)

OTHER PUBLICATIONS

Non-English International Search Report and Written Opinion dated Jul. 21, 2017 for Application No. PCT/CN2017/082269.
(Continued)

*Primary Examiner* — Antoinette T Spinks
(74) *Attorney, Agent, or Firm* — Ladas & Parry LLP

(57) ABSTRACT

An electronic module is provided. The electronic module includes a bracket, a first electronic component and a second electronic component. The bracket includes a housing and a barrier rib, and a conductive paste is coated on the barrier rib. The first electronic component and a second electronic component, are accommodated in the bracket and spaced from each other by the barrier rib, and electrically connected to each other through the conductive paste. A terminal device and a bracket are also provided.

7 Claims, 4 Drawing Sheets

(51) Int. Cl.
  *H04M 1/02* (2006.01)
  *H04R 1/02* (2006.01)
  *H05K 5/02* (2006.01)
  *G03B 17/12* (2006.01)
  *G06F 1/16* (2006.01)

(52) U.S. Cl.
  CPC ........ *H04M 1/0264* (2013.01); *H04N 5/2252* (2013.01); *H04N 5/2253* (2013.01); *H04N 5/2257* (2013.01); *H04N 5/2258* (2013.01); *H04R 1/025* (2013.01); *H04R 1/028* (2013.01); *H05K 5/0217* (2013.01); *H05K 9/0009* (2013.01); *H04R 2499/11* (2013.01)

(56) References Cited

U.S. PATENT DOCUMENTS

| | | | | |
|---|---|---|---|---|
| 2004/0106440 | A1* | 6/2004 | Haruyama | H04M 1/0264 455/566 |
| 2007/0275596 | A1 | 11/2007 | Ryu | |
| 2012/0287317 | A1* | 11/2012 | Tobinaga | H04N 5/2171 348/294 |

FOREIGN PATENT DOCUMENTS

| | | | |
|---|---|---|---|
| CN | 104333687 | A | 2/2015 |
| CN | 204291169 | U | 4/2015 |
| CN | 204305161 | U | 4/2015 |
| CN | 204305164 | U | 4/2015 |
| CN | 204305182 | U | 4/2015 |
| CN | 104932174 | A | 9/2015 |
| CN | 204948203 | U | 1/2016 |
| CN | 205416194 | U | 8/2016 |
| CN | 205430408 | U * | 8/2016 |
| CN | 205430408 | U | 8/2016 |
| CN | 205545571 | U | 8/2016 |
| CN | 205545574 | U | 8/2016 |
| CN | 205545580 | U | 8/2016 |
| CN | 205647689 | U | 10/2016 |
| CN | 106231018 | A | 12/2016 |

OTHER PUBLICATIONS

English abstract of CN 205430408 U.
English abstract of CN 102804055 A.
English abstract of CN 204948203 U.
English abstract of CN 204291169 U.
English abstract of CN 205416194 U.
Search Report dated Mar. 19, 2018 for Application No. EP 17 20 8963.
English abstract of CN 205545571 U.
English abstract of CN 205647689 U.
English abstract of CN 205545574 U.
English abstract of CN 106231018 A.
English abstract of CN 205545580 U.
English abstract of CN 104333687 A.

* cited by examiner

BRACKET, ELECTRONIC MODULE, AND TERMINAL DEVICE

CROSS-REFERENCE TO RELATED APPLICATIONS

This application claims all benefits accruing under 35 U.S.C. § 119 from China Patent Application No. 201611185477.7, filed on Dec. 20, 2016 in the State Intellectual Property Office of China, the contents of which are hereby incorporated by reference.

FIELD

The present disclosure relates to the field of mobile device, and particularly relates to a bracket, a camera module, and a terminal device.

BACKGROUND

With the development of smart phones, the electronic component within mobile phones, such as camera device, is often supported by a bracket. Some mobile phone adopts two electronic components such as cameras or speakers. The two electronic components have different design parameters to achieve special shooting or audio playback. However, the two electronic components often generate electromagnetic interference.

DETAILED DESCRIPTION

Figure 1:
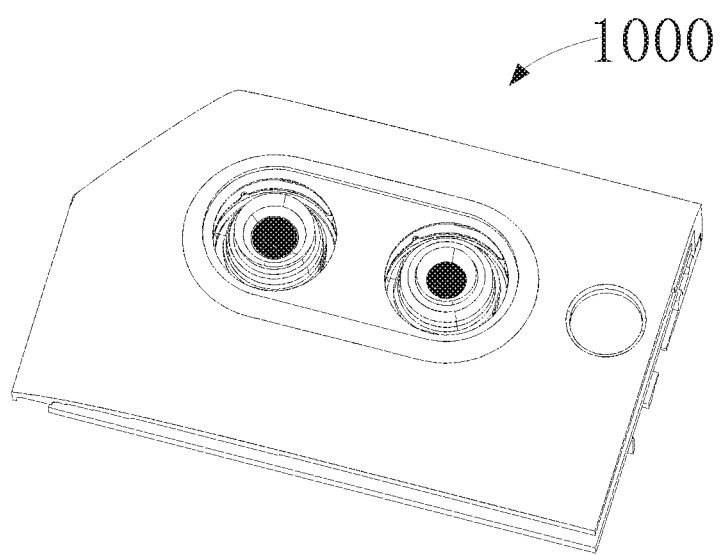
FIG. 1 shows a schematic view of one embodiment of a partial structure of a terminal device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein.

The embodiments of the present invention are described in detail below, examples of which are shown in the accompanying drawings. The embodiments described below with reference to the accompanying drawings are exemplary and are intended to be illustrative of the invention and are not to be construed as limiting the invention.

In the description of the present invention, it can be understood that, the terms "center", "upper", "down", "front", "rear", "left", "right", "vertical", "top", "bottom", "inside", "outside", "surrounding" are based on the azimuth or the positional relationship shown in the drawings. The terms are used for the purpose of facilitating the description of the invention and simplified description. Rather than indicating that the device or element must have a specific orientation, constructed and operated in a particular orientation, and therefore cannot be construed as limiting the invention.

It should be noted that the mobile terminal may be a mobile phone, a tablet computer, a notebook computer, or the like. The electronic module can be a camera module, a speaker module, or other electronic module comprising electronic components and mechanical components. In one embodiment, the electronic module can be camera module used in the mobile phone.

Figure 2:
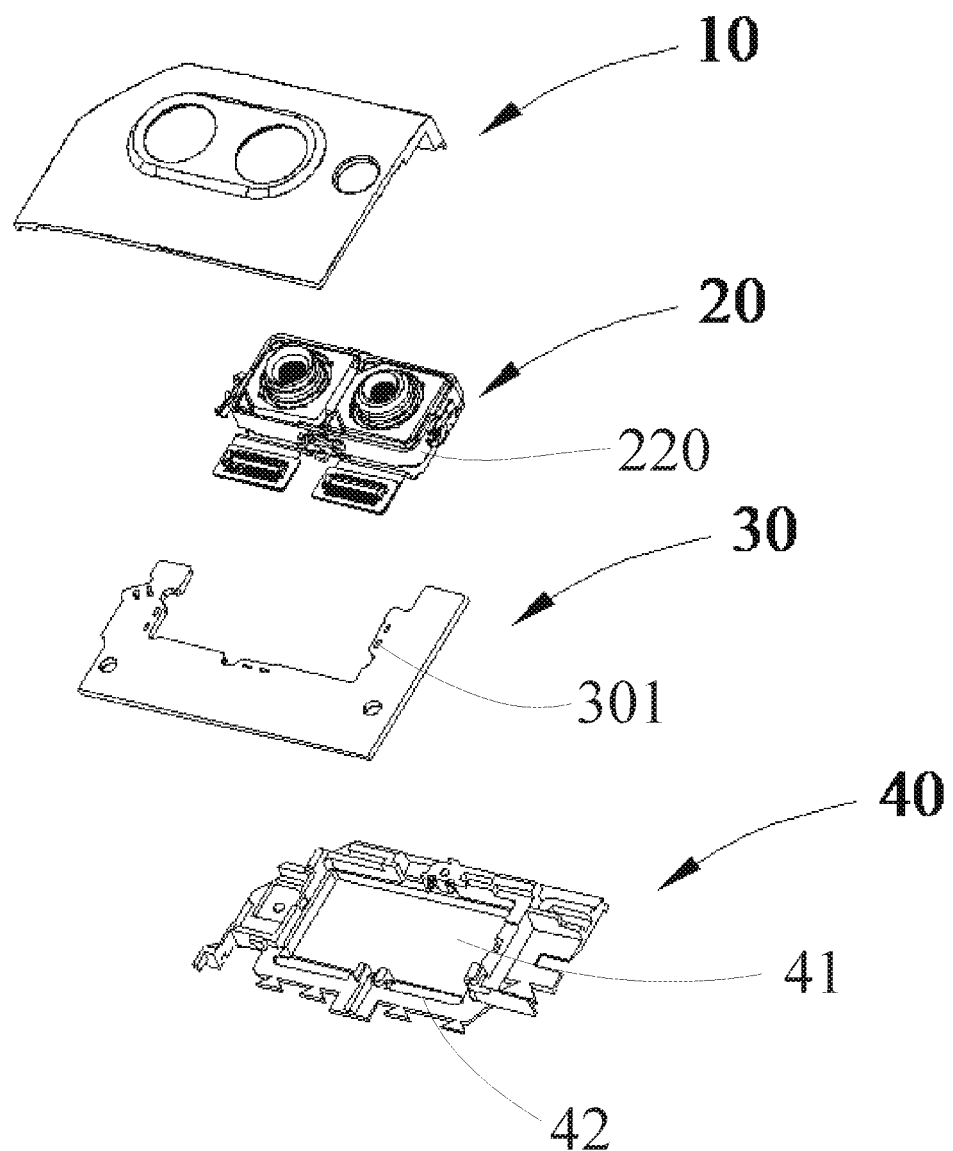
FIG. 2 shows a schematic exploded view of one embodiment of the partial structure of the terminal device.

Referring to FIGS. 1-2, one embodiment of a partial structure of a terminal device 1000 is shown for simplification. The terminal device 1000 comprises a shell 10, a camera module 20, a main plate 30, and a frame 40. The shell 10 and the frame 40 are engaged with each other. The camera module 20 and the main plate 30 are sandwiched between the shell and the frame 40. The shell 10 and the frame 40 can be engaged with each other through hooks and buckles. The shell 10 can be a back cover of the terminal device.

The camera module 20 and the main plate 30 are located on the frame 40. In one embodiment, the frame 40 defines a accommodate space 41 configured to securely mount the camera module 20. Furthermore, a plurality of support ribs 42 can be formed around the accommodate space 41, and the main plate 30 can be mounted on a top surface of the plurality of support ribs 42. The main plate 30 is adjacent to and electrically connected to the camera module 20. The frame 40 can be a middle frame of the terminal device.

In one embodiment, the main plate 30 can be U-shaped structure with two cantilevers to accommodate the camera module 20. Furthermore, the main plate 30 defines a plurality of limit holes 31 distributed on the main plate 30. The plurality of limit holes 31 is configured to secure the camera module 20.

Figure 3:
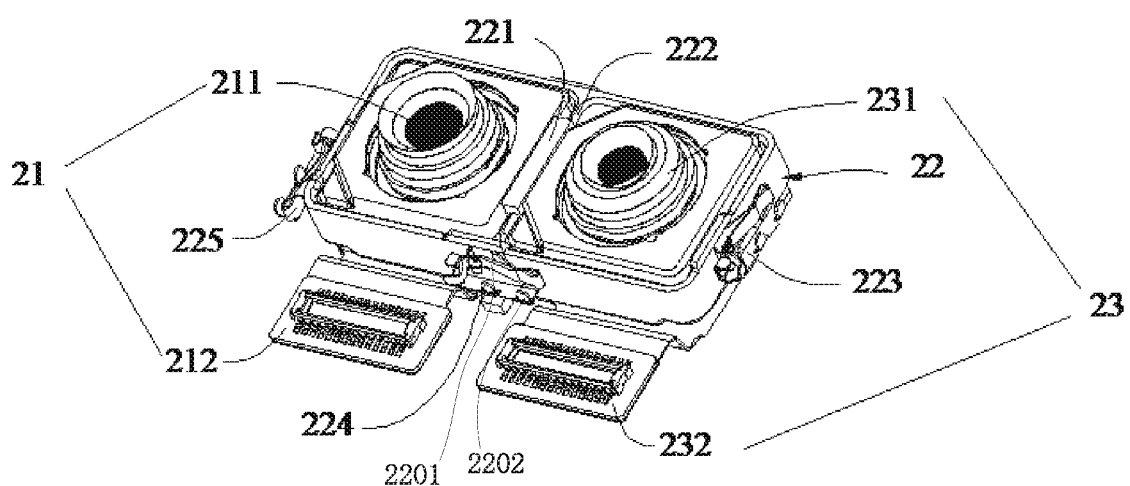
FIG. 3 shows a schematic view of one embodiment of a camera module.

Further referring to FIG. 3, the camera module 20 comprises a bracket 22, a first camera component 21, and a second camera component 23. As shown in FIG. 3, both the first camera component 21 and the camera component 23 are accommodated in the bracket 22, and the bracket 22 secures the first camera component 21 and the second camera component 23. Both the first camera component 21 and the second camera component 23 can be electrically connected to the main plate 30. Furthermore, both the first camera component 21 and the second camera component 23 include a metal housing (not shown). The metal housing is functioned as a mechanical shield and an electrostatic shield. Furthermore, the first camera component 21 and the second camera component 23 are isolated from each other. In other embodiments, the electronic device can include other electronic module such as a speaker module.

The first camera component 21 comprises a first camera 211 and a first circuit board 212, and the second camera component 23 comprises a first camera 231 and a first circuit board 232. The metal housing surrounds on an outer surface of the first camera 211 and the second camera 231 respectively. The first camera 211 and the second camera 231 have different focal length, separate drive units, and separate sensors respectively. Thus the photograph can be sharper and has better depth-of-field, and the image quality can be greatly improved even in the dark environment.

The first camera 211 can be electrically connected to the first circuit board 212; a first BTB (board to board) connector can be located on the first circuit board 212. The first BTB connector is connected to the main plate 30, thereby the first camera 211 is electrically connected to the main plate 30. Furthermore, the second camera 231 is electrically connected to the second circuit board 232, and a second BTB connector can be located on the second circuit board 232. The second BTB connector can be inserted into the main plate 30, thus the second camera 231 can also be electrically connected to the main plate 30.

Figure 4:
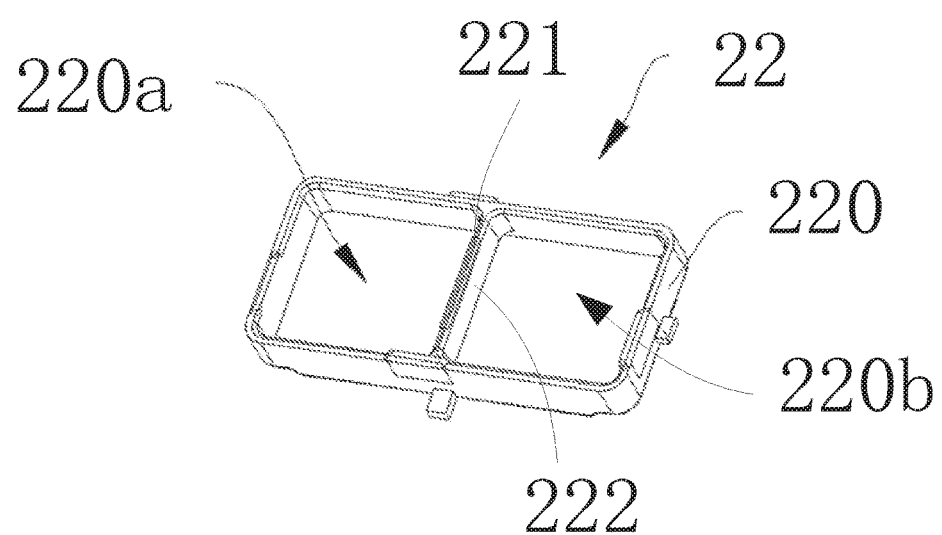
FIG. 4 shows a schematic view of one embodiment of a housing in the camera module.

Further referring to FIG. 4, the bracket 22 comprises a housing 220 with a barrier rib 222 therein. The barrier rib 222 divides the housing 220 into two a first space 220a and a second space 220b. The first camera component 21 can be embedded in the first space 220a, and the second camera component 23 can be embedded in the second space 220b. The barrier rib 222 is sandwiched between the first camera component 21 and the second camera component 23, and the first camera component 21 is spaced apart from the second camera component 23. The barrier rib 222 serves to reinforce the bracket 22, and securely fixes the first camera component 21 and the second camera component 23.

In one embodiment, the barrier rib 222 is coated with a conductive paste 221. The conductive paste 221 can be a silver paste 221, and the silver paste 221 can be coated on entire outer surface of the barrier rib 222. The first camera component 21 and the second camera component 23 are in contact with the conductive paste 221. Thus the first camera component 21 and the second camera component 23 are electrically connected through the conductive paste 221.

In one embodiment, while there are at least two electrical components in the electrical module, there is also a plurality of barrier ribs in the electrical module. Each of the plurality of barrier ribs can be sandwiched between each two adjacent electrical components. Thus the connection between the plurality of electrical components and the bracket 22 can be enhanced, and the stability of the electrical device can be ensured.

Furthermore, in one embodiment, the barrier rib can be avoided, and the conductive paste can be coated between outer surfaces of each two adjacent electronic components.

In one embodiment, the conductive paste 221 can be silver paste, and the silver paste has excellent electrical conductivity and strong adhesion. The conductive paste can be conductive belt, conductive foam, or conductive colloid filled between the metal shells of the electronic components.

Due to the conductive paste 221 located between the first camera component 21 and the second camera component 23, the first camera component 21 and the second camera component 23 can be electrically connected. Thus the first camera component 21 and the second camera component 23 can have equal potential. The formation of a current loop between the first camera component 21 and the second camera component 23 can be avoided. Thus the electromagnetic interference can be reduced, and the heat dissipation area can be expanded to enhance the heat dissipation performance of the individual camera components. Furthermore, because of the barrier rib in the bracket 22 including the barrier rib 222, the connection between the camera module 20 and the bracket 22 is enhanced, and the stability of the camera module 20 can be improved.

The bracket 22 can be conductive, and electrically connected to a ground electrode on the main plate 30. The bracket 22 can has a ground portion electrically connected to the ground electrode. Thus, both the first camera component 21 and the second camera component 23 are electrically connected to the bracket 22 through the conductive paste 221. Then the first camera component 21 and the second camera component 23 can be grounded through the bracket 22. The number of ground points/lines can be reduced, and the process can be simplified. The debug complexity of the camera module 20 can be reduced. Furthermore, the electromagnetic energy of the radiation of the camera module is greatly reduced, and the influence to the antenna radiation of the terminal device is also weakened. It can be understood that, the bracket 22 can also be an insulator.

Furthermore, a ground portion (not shown) can be located on the outside of the bracket 22, and connected to the ground electrode on the main plate 30. Thus the bracket 22 can be ground through the ground portion. And the number of the ground portions is at least one.

In one embodiment, the ground portion can be in direct contact with at least one spring tab located at outer side of the bracket. In one embodiment, a first spring tab 223, a second spring tab 224, and a third spring tab 225 surround outer sides of the bracket 22 and in directly contact with the bracket 22. One end of the spring tab has a contact point 2201 which is in resiliently contact with the bracket 22, and the other end has a pin 2202 which is configured to be fixed on the main plate 30. Furthermore, a plurality of fixing holes 301 can be defined on the main plate 30, and the pin 2202 can insert into one of the fixing holes 301. Thus the spring tab 220 can be firmly fixed on the main plate 30, and directly contact with both the main plate 30 and the camera module 20. Therefore, the camera module 20 is grounded through the plurality of contact points 2201. Then the connection stability between the camera module 20 and the ground is enhanced, the electromagnetic energy radiated from the camera module 20 can be reduced, and the influence to the antenna radiation of the terminal device can be decreased.

In other embodiments, the structure of the spring tab is not limited, and the number of spring tabs may also be set as desired. Alternatively, other conductive members may be provided as the ground portion in place of the spring tabs.

The embodiments shown and described above are only examples. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and comprising the full extent established by the broad general meaning of the terms used in the claims. It will therefore be appreciated that the embodiments described above may be modified within the scope of the claims.

What is claimed is:

1. A terminal device comprising:
   a shell;
   a frame, wherein the frame is engaged with the shell;
   a camera module, wherein the camera module is located on the frame, and the camera module comprises:
   a bracket, the bracket comprises a housing and a barrier rib, and a conductive paste is coated on the barrier rib;
   a first electronic component and a second electronic component, wherein the first electronic component and the second electronic component are accommodated in the bracket and spaced from each other by the barrier rib, and electrically connected to each other through the conductive paste, so as to have equal potential between the first electronic component and the second electronic component;
   wherein the housing defines a first space and a second space divided by the barrier rib;
   a main plate, wherein the main plate is located on the frame and electrically connected to the camera module wherein the camera module and the main plate are sandwiched between the shell and the frame.

2. The terminal device of claim 1, wherein the frame defines a accommodate space, and the camera module is securely mounted in the accommodate space.

3. The terminal device of claim 2, wherein the frame comprises a plurality of support ribs around the accommodate space, and the main plate is mounted on a top surface of the plurality of support ribs.

4. The terminal device of claim 1, wherein the bracket is electrically connected to the main plate, and the main plate is grounded.

5. The terminal device of claim 4, wherein the first electronic component and the second electronic component are grounded through the conductive paste, the bracket, and the main plate.

6. The terminal device of claim 4, further comprising a spring tab sandwiched between the bracket and the main plate, the spring tab comprises a contact point being direct contact with the bracket, and the bracket is grounded through the spring tab.

7. The terminal device of claim 6, wherein the spring tab comprises a pin, the main plate defines a plurality of fixing holes, and the spring tab is fixed on the main plate by insetting the pin in to each of the plurality of fixing holes.

* * * * *